(12) United States Patent
Nakata et al.

(10) Patent No.: US 11,445,627 B2
(45) Date of Patent: Sep. 13, 2022

(54) RESIN CARD MEDIUM AND MANUFACTURING METHOD THEREFOR

(71) Applicants: SHOEI PRINTING CO., LTD., Osaka (JP); TOMOEGAWA CO., LTD., Tokyo (JP)

(72) Inventors: Tomohiro Nakata, Osaka (JP); Hideki Moriuchi, Shizuoka (JP)

(73) Assignees: SHOEI PRINTING CO., LTD., Osaka (JP); TOMOEGAWA CO., LTD., Tokyo (JP)

( * ) Notice: Subject to any disclaimer, the term of this patent is extended or adjusted under 35 U.S.C. 154(b) by 0 days.

(21) Appl. No.: 16/649,303

(22) PCT Filed: Sep. 20, 2018

(86) PCT No.: PCT/JP2018/034895
§ 371 (c)(1),
(2) Date: Mar. 20, 2020

(87) PCT Pub. No.: WO2019/059305
PCT Pub. Date: Mar. 28, 2019

(65) Prior Publication Data
US 2020/0267864 A1      Aug. 20, 2020

(30) Foreign Application Priority Data
Sep. 22, 2017   (JP) .............................. JP2017-182232

(51) Int. Cl.
*H05K 5/06*       (2006.01)
*B32B 27/08*      (2006.01)
(Continued)

(52) U.S. Cl.
CPC ............. *H05K 5/065* (2013.01); *B32B 27/08* (2013.01); *B32B 27/20* (2013.01); *B32B 27/281* (2013.01);
(Continued)

(58) Field of Classification Search
CPC ...... H05K 5/065; H05K 5/0017; B32B 27/08; B32B 27/20; B32B 27/281; B32B 27/36; B32B 37/10; B32B 2457/00
See application file for complete search history.

(56) References Cited

U.S. PATENT DOCUMENTS

| | | | |
|---|---|---|---|
| 5,856,662 A | 1/1999 | Kohama et al. | |
| 2004/0031855 A1* | 2/2004 | Takahashi | B32B 33/00 235/492 |

(Continued)

FOREIGN PATENT DOCUMENTS

| | | |
|---|---|---|
| JP | 9-275184 A | 10/1997 |
| JP | 11-78317 A | 3/1999 |

(Continued)

OTHER PUBLICATIONS

International Search Report dated Dec. 11, 2018 issued in corresponding PCT/JP2018/034895 application (2 pages).

(Continued)

*Primary Examiner* — Michael C Miggins
(74) *Attorney, Agent, or Firm* — Millen White Zelano and Branigan, PC; Csaba Henter

(57) ABSTRACT

A resin card medium which has a substrate having electronic components mounted thereon and has sophisticated flatness and smoothness realized without providing any layer having holes for absorbing thicknesses of the electronic components; and a method for manufacturing a resin card medium. A resin card medium laminated body before pressing is prepared by laminating, on a first plastic finishing sheet, a substrate having one electronic component or two or more electronic components installed on one side of the substrate, with the one side, on which the electronic component or electronic components are installed, facing upward, and laminating, on the substrate, mixed paper constituted of plastic fibers and plant fibers, and by subjecting the resin (Continued)

card medium laminated body to hot pressing at a temperature which is a softening point or more of the plastic fibers and less than a melting point of the plastic fibers.

23 Claims, 15 Drawing Sheets

(51) Int. Cl.
    *B32B 27/20*     (2006.01)
    *B32B 27/28*     (2006.01)
    *B32B 27/36*     (2006.01)
    *B32B 37/10*     (2006.01)
    *H05K 5/00*     (2006.01)

(52) U.S. Cl.
    CPC .............. *B32B 27/36* (2013.01); *B32B 37/10* (2013.01); *H05K 5/0017* (2013.01); *B32B 2457/00* (2013.01)

(56) References Cited

U.S. PATENT DOCUMENTS

| | | | | |
|---|---|---|---|---|
| 2004/0129788 A1* | 7/2004 | Takahashi | ............ | G06K 19/145 235/492 |
| 2006/0227523 A1* | 10/2006 | Pennaz | .................... | H05K 1/18 361/783 |
| 2013/0240632 A1 | 9/2013 | Vogt et al. | | |
| 2014/0242356 A1 | 8/2014 | Le Loarer | | |
| 2015/0286922 A1* | 10/2015 | Saito | ........................ | G07C 9/28 340/5.82 |
| 2016/0004948 A1* | 1/2016 | Goetz | .................... | B29C 66/01 156/196 |
| 2018/0349751 A1* | 12/2018 | Herslow | ................ | B42D 25/41 |

FOREIGN PATENT DOCUMENTS

| | | |
|---|---|---|
| JP | 11-139048 A | 5/1999 |
| JP | 2000155821 A | 6/2000 |
| JP | 2004098368 A | 4/2004 |
| JP | 2005332304 A | 12/2005 |
| JP | 2012045720 A | 3/2012 |
| WO | 12014112 A1 | 2/2012 |

OTHER PUBLICATIONS

English Abstract of JP 11-78317 A published Mar. 23, 1999.
English Abstract of JP 11-139048 A published May 25, 1999.
Machine translation of corresponding Japanese Patent Application No. 2019-541491 dated Dec. 3, 2019 (pp. 1-9).
Official Communication dated Jul. 2, 2021 in corresponding European Patent Application No. 18859205.9 (pp. 1-7).

\* cited by examiner

RESIN CARD MEDIUM AND MANUFACTURING METHOD THEREFOR

TECHNICAL FIELD

The present invention relates to a resin card medium, which includes an electronic component or electronic components such as an IC chip or IC chips and is flat and smooth, and a manufacturing method therefor and, in particular, to a resin card medium which is obtained by laminating mixed paper on a surface of a substrate on a side on which the electronic component or electronic components are mounted and by conducting hot pressing therefor, has a card warpage amount thereof in conformity with an ISO/IEC 7810:2003 standard of 1.5 mm or less, and besides the above-mentioned ISO standard, achieves a depth of a card local depressed part thereof of less than 0.2 mm, and a manufacturing method therefor.

BACKGROUND ART

In recent years, in order to meet the demands for high functionality, multi-functionality, enhancement in security performance, and the like, it is often the case that a substrate on which electronic components such as an IC (Integrated Circuit) chip as a variable information recording medium having a large capacity, an antenna circuit for receiving electricity and signals from the outside, a display part for displaying information, and a sensor part for detecting a fingerprint or the like are mounted is incorporated into a card.

As a method for incorporating, into the card, the substrate on which the electronic components are mounted, known is a method in which front and rear surfaces of the substrate are coated with synthetic resin; a method in which a synthetic resin sheet and a fiber sheet are laminated on front and rear surfaces of the substrate and the resultant laminate is subjected to hot pressing; or the like. In addition, as other manufacturing method, also known is a method in which synthetic resin sheets on front and rear surfaces thereof are bonded with an adhesive.

Whereas a thickness of a general card is approximately 1 mm, a thickness of an electronic component such as an IC chip is approximately 0.15 mm to 0.60 mm and further, a thickness of a substrate is also approximately 0.1 mm. Therefore, on a surface pf the IC card including these, a projecting portion is formed due to the thickness of the electronic component such as the IC chip, thereby deteriorating flatness and smoothness. In addition, if an external force is exerted on the projecting portion formed by the electronic component, the problem in that the electronic component is easily broken arises. Furthermore, appearance and printability of the IC card are impaired, thereby also leading to the problem in that an appearance commercial value is reduced.

Therefore, as a method for incorporating, into a card, a substrate on which an electronic component such as an IC chip is mounted while the above-mentioned problems are solved, for example, as described in Japanese Patent Application Laid-Open Publication No. 2005-242978 (Patent Literature 1), known is a method in which by previously providing a depressed part or a hole for a paper layer (spacer layer) covering a surface of the substrate on which the electronic component is mounted, a thickness of the electronic component is absorbed. However, in the incorporating method described in Patent Literature 1, it is required to change a shape and a placement position of the depressed part or the hole of the paper layer in accordance with a shape and a placement position of the electronic component on the substrate, thereby leading to the problem in that extremely burdensome processes are required and costs are also increased.

In addition, as a method for absorbing the thickness of the electronic component without providing the depressed part or the hole for the spacer layer or the like, for example, as described in Japanese Patent Application Laid-Open Publication No. 2004-264665 (Patent Literature 2), known is a method in which by covering, with an adhesive layer (hot melt layer) having a predetermined thickness, the surface of the substrate on which the electronic component is mounted, the thickness of the electronic component is absorbed. However, in the incorporating method described in Patent Literature 2, since the adhesive layer (hot melt layer) on the electronic component on the surface of the substrate is melt once, there arises the problem in that due to solidification speed unevenness upon curing resin, a sink is caused, a sufficient degree of flatness cannot be thereby obtained, or warpage is easily caused. In addition, there is a risk of damaging the electronic component due to an influence of heat, thereby also leading to the problem in that an electronic component to be used is limited only to an electronic component having heat resisting properties to some extent.

Furthermore, as other method for absorbing the thickness of the electronic component without providing the depressed part or the hole for the spacer layer or the like, for example, as described in Japanese Patent Application Laid-Open Publication No. H5-229293 (Patent Literature 3) and Japanese Patent Application Laid-Open Publication No. H9-275184 (Patent Literature 4), known is a method in which by covering, with fibers which are impregnated with molten resin or a fiber sheet such as paper and woven fabric, a surface of the substrate on which an electronic component is mounted, the thickness of the electronic component is absorbed.

In the method described in each of Patent Literatures 3 and 4, since the thickness of the electronic component is absorbed by the fibers or the fiber sheet, as compared with the case in which only the adhesive layer (hot melt layer) is used, a local sink due to the solidification speed unevenness upon curing the resin is hindered from occurring, thereby enhancing flatness of the card and also enhancing a mechanical strength such as a bending strength. However, in the method described in each of Patent Literatures 3 and 4, since the resin with which the fibers or the fiber sheet is impregnated is in a molten state, shrinkage unevenness of the fibers or the fiber sheet is caused or promoted due to the solidification speed unevenness upon curing the resin, thereby resulting in the problem in that warpage of the card becomes large. In particular, there arises the problem in that when the electronic component or the substrate on which the electronic component is mounted is displaced to either one of a front side or a rear side of the card, the warpage of the card tends to become further large.

CITATION LIST

Patent Literature

[Patent Literature 1] Japanese Patent Application Laid-Open Publication No. 2005-242978
[Patent Literature 2] Japanese Patent Application Laid-Open Publication No. 2004-264665
[Patent Literature 3] Japanese Patent Application Laid-Open Publication No. H5-229293

[Patent Literature 4] Japanese Patent Application Laid-Open Publication No. H9-275184

SUMMARY OF THE INVENTION

Technical Problem

Therefore, objects of the present invention are to provide a resin card medium which has a substrate having an electronic component or electronic components such as an IC chip or IC chips or like thereinside, has extremely high flatness (for example, with a warpage amount suppressed) and high smoothness (for example, with a depth of a local depressed part suppressed) which are attained by ordinary hot pressing molding without providing a spacer layer or the like having a depressed portion or a hole for absorbing thicknesses of the substrate and the electronic component or electronic components, is excellent in appearance and printability of the card, and has high appearance commercial value; and a manufacturing method therefor.

Solution to Problem

The present inventors, et al. have repeated eager researches as to a mechanism which causes a sink and warpage of a resin card medium which has a substrate having mounted thereon an electronic component or electronic components such as an IC chip or IC chips or the like, due to solidification speed unevenness upon curing resin. As a result, the present inventors, et al. have found out that using plastic fibers, instead of molten resin, and conducting hot pressing at a temperature which is a softening point or more of the plastic fibers and less than a melting point of the plastic fibers are extremely effective in suppressing solidification speed unevenness upon curing resin. Furthermore, the present inventors, et al. have found out that using mixed paper whose plastic fibers are mixed with plant fibers moderately suppresses a release of a residual stress inside the card, which is caused by the solidification speed unevenness or the like, and as a result, the warpage of the card can be effectively prevented, hence leading to the completion of the present invention.

In other words, according to the present invention, a resin card medium laminated body before pressing is prepared by laminating a substrate having one electronic component or two or more electronic components installed on one side of the substrate on a first plastic finishing sheet, with the one side of the substrate, on which the electronic component or electronic components are installed, facing upward; and laminating, on the substrate, mixed paper constituted of plastic fibers, which are constituted of copolymerized polyester resin such as PET resin, and plant fibers, and the resin card medium laminated body is subjected to hot pressing at a temperature which is a softening point or more of the plastic fibers and less than a melting point of the plastic fibers, thereby providing a resin card medium whose card warpage amount in conformity with an ISO/IEC 7810:2003 standard is 1.5 mm or less, and besides the ISO standard, a depth of a card local depressed part of the resin card medium is less than 0.2 mm.

In the resin card medium of the present invention, on the substrate on the side on which the electronic component or electronic components such as an IC chip or IC chips or the like are mounted, the mixed paper constituted of the plastic fibers which are constituted of the copolymerized polyester resin such as the PET resin and the plant fibers is laminated, and the card medium laminated body which includes the substrate having the electronic component or electronic components mounted thereon and the mixed paper is subjected to the hot pressing at the temperature which is the softening point or more of the plastic fibers in the mixed paper and less than the melting point thereof, thereby conducting compression-molding.

Since the temperature upon hot pressing is managed at the temperature which is the softening point or more of the plastic fibers constituted of the copolymerized polyester resin such as the PET resin in the mixed paper and less than the melting point thereof, the plastic fibers in the mixed paper neither melt nor a sink and warpage of the card medium are caused due to solidification speed unevenness of the molten plastic. In other words, it has been found out that a sink and warpage of the card medium caused due to curing speed unevenness of the softened plastic fibers are much smaller than a sink and warpage of the card medium caused due to solidification speed unevenness of molten plastic.

In addition, as a main factor which causes the warpage of the resin card medium after hot pressing molding, it is considered that an internal stress is caused in the card medium due to the solidification speed unevenness upon curing the resin, and the internal stress is released after the molding, resulting in the warpage of the resin card medium.

Since in the resin card medium of the present invention, the plant fibers whose shape, nature, and the like hardly change even if an influence of heat is exerted thereon are contained in the mixed paper, flowing of the softened resin is inhibited, and even if a residual stress in the card is caused due the curing speed unevenness or the like of the plastic fibers constituted of the copolymerized polyester resin such as softened PET resin or the like, the plant fibers serve as a reinforcing material and deformation of the card is restrained, and as a result, the release of the residual stress is prevented, thereby preventing the warpage and the deformation of the card.

In addition, since upon hot pressing, the mixed paper constituted of the plastic fibers constituted of the copolymerized polyester resin such as the PET resin and the plant fibers functions as a cushion material, the mixed paper absorbs a thickness or thicknesses of the electronic component or electronic components so as to keep flatness of the card medium after molding. As described above, in order for the mixed paper to surely absorb the thickness or thicknesses of the electronic component or electronic components, it is preferable that a percentage of a total of a thickness of the substrate and a thickness or thicknesses of the electronic component or electronic components to a thickness of the card medium after the hot pressing molding is adjusted to be 80% or less, and it is more preferable that the percentage of the total of the thickness of the substrate and the thickness or the thicknesses of the electronic component or electronic components to the thickness of the resin card medium after the hot pressing molding is adjusted to be 70% or less. As a result of this, extremely excellent flatness and smoothness in that the card warpage amount of the resin card medium of the present invention in conformity with the ISO/IEC 7810: 2003 standard is 1.5 mm or less and besides the ISO standard, the depth of the card local depressed part thereof is less than 0.2 mm can be obtained.

In other words, the resin card medium of the present invention is a card medium which includes a substrate having one electronic component or two or more electronic components installed on one side of the substrate; a plant fiber-containing resin layer being laminated on a surface of the substrate on a side on which the electronic component or electronic components are installed and containing plant fibers; and a first finishing layer being laminated on a surface of the substrate on a side opposite to the side on which the electronic component or electronic components are installed, and the resin card medium of the present invention has characteristics in that it is preferable that a percentage of a total of a thickness of the substrate and a thickness or thicknesses of the electronic component or electronic components to a thickness of the card medium is 80% or less, and it is more preferable that the percentage of the total of the thickness of the substrate and the thickness or thicknesses of the electronic component or electronic components to the thickness of the card medium is 70% or less.

In addition, in consideration of versatility thereof, it is preferable that a shape and dimensions of the resin card medium of the present invention are in conformity with the ISO/IEC 7810:2003 standard. As described above, the resin card medium of the present invention can have the extremely excellent flatness and smoothness in that the card warpage amount in conformity with the ISO standard is 1.5 mm or less and besides the ISO standard, the depth of the card local depressed part is less than 0.2 mm.

It is considered that in the resin card medium, the solidification speed unevenness of the molten plastic attributable to temperature unevenness and the curing speed unevenness of the softened plastic fibers are promoted also by displacement of a position of the substrate having the electronic component or electronic components mounted thereon from a middle position in a thickness direction to a front side or a rear side. However, since in the resin card medium of the present invention, the plant fibers whose shape, nature, and the like hardly change even if an influence of heat is exerted thereon are contained in the mixed paper, even when the temperature unevenness and the curing speed unevenness of the plastic fibers are caused by the placement of the substrate which is displaced to the front side or the rear side, the plant fibers serve as the reinforcing material, card deformation is thereby restrained, and as a result, the release of the residual stress is prevented, thereby preventing the warpage and the deformation of the card.

Therefore, even in a case in which the substrate having the electronic component or electronic components mounted thereon is located in the middle position in the thickness direction of the card medium in a longitudinal cross sectional view or in a case in which the substrate is located in such a way as to be displaced from the middle position to the front side or the rear side, the resin card medium of the present invention can have the extremely excellent flatness and smoothness in that the card warpage amount in conformity with the ISO/IEC 7810:2003 standard is 1.5 mm or less and besides the ISO standard, the depth of the card local depressed part is less than 0.2 mm.

When in the resin card medium of the present invention, electronic components, such as a display part, a fingerprint detection part, and the like, which need access to the outside are attached, by providing an opening part for one part of the plant fiber-containing resin layer (the mixed paper constituted of the plastic fibers and the plant fibers before the hot pressing molding) covering the substrate, the display part and/or the fingerprint detection part attached on the substrate can be exposed outside.

For the purpose of enhancing printability, glossiness, scratch resistance, and the like of a surface of the card, in the resin card medium of the present invention, on the plant fiber-containing resin layer which absorbs the thickness or thicknesses of the electronic component or electronic components, a second finishing layer may be further laminated. In addition, in consideration of a softening temperature at which the electronic component or electronic components are not damaged, durability and easiness of handling as a card material, and the like, it is preferable that each of the second finishing layer and/or the first finishing layer which is laminated on a rear surface of the substrate having the electronic component or electronic components mounted thereon is a plant fiber-non-containing resin layer containing no plant fibers, and further, a material of resin such as polyvinyl chloride (PVC), polyethylene terephthalate (PET), polyethylene terephthalate glycol-modified (PETG), polycarbonate (PC), acrylonitrile butadiene styrene (ABS), and the like can be used as the plant fiber-non-containing resin layer.

As described above, a method for manufacturing the resin card medium of the present invention which is extremely excellent in the flatness and the smoothness has characteristics in that a resin card medium laminated body before pressing is prepared by including the steps of preparing a first plastic finishing sheet; laminating, on the first finishing sheet, a substrate having one electronic component or two or more electronic components installed on one side of the substrate, with the one side of the substrate, on which the electronic component or electronic components are installed, facing upward; and laminating, on the substrate, mixed paper being constituted of plastic fibers plastic fibers constituted of the copolymerized polyester resin such as the PET resin and plant fibers, and the resin card medium laminated body is subjected to hot pressing at a temperature which is a softening point or more of the plastic fibers and less than a melting point of the plastic fibers.

In addition, in a case in which the resin card medium of the present invention is manufactured by conducting the lamination in order reverse to the order of the above-described manufacturing method and conducting the molding, this manufacturing method has characteristics in that a resin card medium laminated body before pressing is prepared by including the steps of laminating mixed paper being constituted of plastic fibers constituted of the copolymerized polyester resin such as the PET resin and plant fibers; laminating, on the mixed paper, a substrate having one electronic component or two or more electronic components installed on one side of the substrate, with the one side of the substrate, on which the electronic component or electronic components are installed, facing downward; and laminating a first plastic finishing sheet on the substrate, and the resin card medium laminated body is subjected to hot pressing at a temperature which is a softening point or more of the plastic fibers and less than a melting point of the plastic fibers.

In the method for manufacturing the card medium of the present invention, on the substrate on the side on which the electronic component or electronic components such as an IC chip or IC chips or the like are mounted, the mixed paper constituted of the plastic fibers and plant fibers is laminated, and the card medium laminated body which includes the substrate having the electronic component or electronic components mounted thereon and the mixed paper is subjected to the hot pressing at the temperature which is the softening point or more of the plastic fibers in the mixed paper and less than the melting point thereof, thereby conducting compression-molding.

Since the temperature upon hot pressing is managed at the temperature which is the softening point or more of the plastic fibers constituted of the copolymerized polyester resin such as the PET resin in the mixed paper and less than the melting point thereof, the plastic fibers in the mixed paper neither melt nor a sink and warpage of the card medium are caused due to solidification speed unevenness of molten plastic. In other words, it has been found out that a sink and warpage of the card medium caused due to curing speed unevenness of the softened plastic fibers are much smaller than a sink and warpage of the card medium caused due to solidification speed unevenness of the molten plastic.

In addition, in the method for manufacturing the card medium of the present invention, the plant fibers whose shape, nature, and the like hardly change even if an influence of heat is exerted thereon are contained in the mixed paper, flowing of the softened resin is inhibited, and even if a residual stress in the card is caused due the curing speed unevenness or the like of the plastic fibers constituted of the copolymerized polyester resin such as softened PET resin or the like, the plant fibers serve as a reinforcing material and deformation of the card is restrained, and as a result, the release of the residual stress is prevented, thereby preventing the warpage and the deformation of the card.

Furthermore, in the method for manufacturing the card medium of the present invention, since upon hot pressing, the mixed paper constituted of the plastic fibers constituted of the copolymerized polyester resin such as the PET resin and the plant fibers functions as a cushion material, the mixed paper absorbs a thickness or thicknesses of the electronic component or electronic components so as to keep flatness of the card medium after molding. As described above, in order for the mixed paper to surely absorb the thickness or thicknesses of the electronic component or electronic components, it is preferable that a percentage of a total of a thickness of the substrate and a thickness or thicknesses of the electronic component or electronic components to a thickness of the card medium after the hot pressing molding is adjusted to be 80% or less, and it is more preferable that the percentage of the total of the thickness of the substrate and the thickness or the thicknesses of the electronic component or electronic components to the thickness of the resin card medium after the hot pressing molding is adjusted to be 70% or less. As a result of this, it is preferable that a shape and dimensions of the resin card medium obtained by the manufacturing method of the present invention are in conformity with the ISO/IEC 7810: 2003 standard, and further, the resin card has extremely excellent flatness and smoothness in that the card warpage amount of the resin card medium of the present invention in conformity with the ISO/IEC 7810:2003 standard is 1.5 mm or less and besides the ISO standard, the depth of the card local depressed part thereof is less than 0.2 mm.

In the method for manufacturing the card medium of the present invention, when electronic components, such as a display part, a fingerprint detection part, and the like, which need access to the outside are attached, by providing an opening part for one part of the plant fiber-containing resin layer (the mixed paper constituted of the plastic fibers and the plant fibers before the hot pressing molding) covering the substrate, the display part and/or the fingerprint detection part attached on the substrate can be exposed outside.

In the method for manufacturing the card medium of the present invention, for the purpose of enhancing printability, glossiness, scratch resistance, and the like, the step of laminating a second finishing layer on the mixed paper which absorbs the thickness or thicknesses of the electronic component or electronic components may be included. In addition, in consideration of a softening temperature at which the electronic component or electronic components are not damaged, durability and easiness of handling as a card material, and the like, it is preferable that each of the second finishing layer and/or the first finishing layer which is laminated on a rear surface of the substrate having the electronic component or electronic components mounted thereon is a plastic sheet containing no plant fibers, and further, a material of resin such as polyvinyl chloride (PVC), polyethylene terephthalate (PET), polyethylene terephthalate glycol-modified (PETG), polycarbonate (PC), acrylonitrile butadiene styrene (ABS), and the like can be used as the plastic sheet.

It is considered that in the resin card medium, the solidification speed unevenness of the molten plastic attributable to temperature unevenness and the curing speed unevenness of the softened plastic fibers are promoted also by displacement of a position of the substrate having the electronic component or electronic components mounted thereon from a middle position in a thickness direction to a front side or a rear side. However, since in the method for manufacturing the card medium of the present invention, the plant fibers whose shape, nature, and the like hardly change even if an influence of heat is exerted thereon are contained in the mixed paper, even when the temperature unevenness and the curing speed unevenness of the plastic fibers are caused by the placement of the substrate which is displaced to the front side or the rear side, the plant fibers serve as the reinforcing material, card deformation is thereby restrained, and as a result, the release of the residual stress is prevented, thereby preventing the warpage and the deformation of the card.

Therefore, in the method for manufacturing the card medium of the present invention, even when a thickness of the mixed paper which is laminated on the surface of the substrate on the side on which the electronic component or electronic components are installed before pressing is the same as a thickness of the first finishing sheet which is laminated beneath the surface of the substrate on a side opposite to the side on which the electronic component or electronic components are installed before pressing or is thicker than the thickness of the first finishing sheet, the resin card medium having the extremely excellent flatness and smoothness in that the card warpage amount in conformity with the ISO/IEC 7810:2003 standard is 1.5 mm or less and besides the ISO standard, the depth of the card local depressed part is less than 0.2 mm can be obtained.

Advantageous Effects of the Invention

According to the present invention, since the temperature upon hot pressing is managed at the temperature which is the softening point or more of the plastic fibers in the mixed paper and less than the melting point thereof, excellent effect in that the plastic fibers in the mixed paper neither melt nor a sink and warpage of the card medium are caused due to the solidification speed unevenness of the molten plastic can be obtained. In other words, excellent effect in that the sink and the warpage of the card medium caused due to the curing speed unevenness of the softened plastic fibers are much smaller than the sink and the warpage of the card medium caused due to the solidification speed unevenness of the molten plastic can be obtained.

According to the present invention, since the plant fibers whose shape, nature, and the like hardly change even if the influence of heat is exerted thereon are contained in the mixed paper, excellent effect in that flowing of the softened resin is inhibited, and even if the residual stress in the card is caused due the curing speed unevenness or the like of the plastic fibers, the plant fibers serve as the reinforcing material and deformation of the card is restrained, and as a result, the release of the residual stress is prevented, thereby preventing the warpage and the deformation of the card can be obtained.

In addition, according to the present invention, since upon hot pressing, the mixed paper constituted of the plastic fibers and the plant fibers functions as the cushion material, the mixed paper absorbs the thickness or thicknesses of the electronic component or electronic components so as to keep the flatness of the card medium after molding. As described above, in order for the mixed paper to surely absorb the thickness or thicknesses of the electronic component or electronic components, it is preferable that the percentage of the total of the thickness of the substrate and the thickness or thicknesses of the electronic component or electronic components to the thickness of the card medium after the hot pressing molding is adjusted to be 80% or less, and it is more preferable that the percentage of the total of the thickness of the substrate and the thickness or the thicknesses of the electronic component or electronic components to the thickness of the resin card medium after the hot pressing molding is adjusted to be 70% or less. As a result of this, according to the present invention, the resin card medium having extremely excellent flatness and smoothness in that the card warpage amount of the resin card medium of the present invention in conformity with the ISO/IEC 7810:2003 standard is 1.5 mm or less and besides the ISO standard, the depth of the card local depressed part thereof is less than 0.2 mm can be obtained.

DESCRIPTION OF EMBODIMENTS

Hereinafter, a resin card medium and a manufacturing method therefor according to one embodiment of the present invention will be described in detail with reference to the accompanying drawings. Note that the present invention is not limited to Examples shown below, and a variety of modifications can be made without departing from the scope of the technical ideas of the present invention.

1. Preparation of Resin Card Mediums

Figure 1:
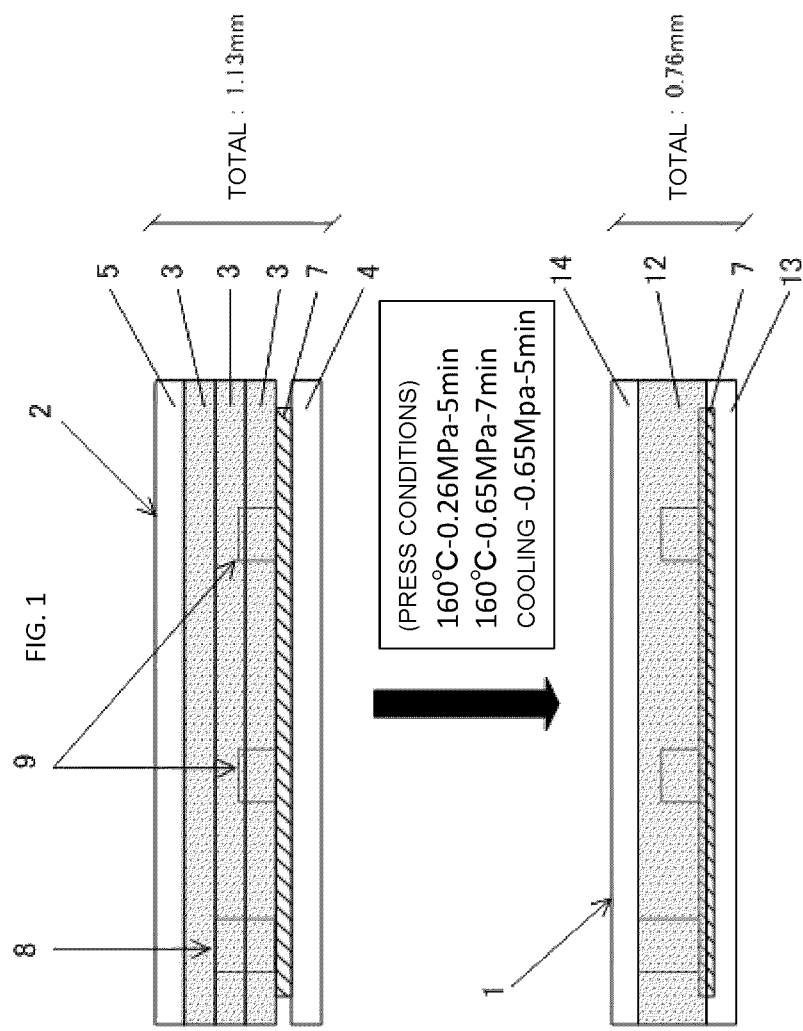
FIG. 1 is a diagram schematically showing cross sections of a card medium in Example 1 before and after hot pressing molding

Example 1 (See FIG. 1)

(1) Card Medium Laminated Body

On a substrate 7 (with a product name "Polyimide Substrate") having a size of 35 mm×78 mm and a thickness of 0.10 mm, one plastic pseudo chip A (8) having a 7-mm-square size and a thickness of 0.4 mm and two plastic pseudo chips B (9) each having a 7-mm-square size and a thickness of 0.25 mm were arranged in appropriate positions, thereby preparing a substrate 7 having the pseudo chips 8 and 9 installed thereon.

Next, one first finishing sheet 4 (with a product name "DIAFIX PG-WHI-FG", manufactured by Mitsubishi Plastics, Inc., having a thickness of 0.20 mm and a melting point of 80° C.) formed of polyethylene terephthalate glycol-modified (PETG) was prepared; on the first finishing sheet 4, the above-mentioned substrate 7 was laminated with a side, on which the pseudo chips 8 and 9 were installed, facing upward; three pieces of mixed paper 3 (with a product name "SC-01", manufactured by TOMOEGAWA CO., LTD., having a thickness of 0.21 mm and a softening point of 130° C.) constituted of copolymerized polyester resin (PET resin) fibers and plant fibers were laminated thereon; and further, one second finishing sheet 5 (with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) was laminated thereon, thereby forming a card medium laminated body 2 in Example 1.

(2) Hot Pressing Molding

The card medium laminated body 2 in Example 1 was heated at a temperature of 160° C. by a hot pressing machine and was thereby softened; the card medium laminated body 2 was held under a pressure of 0.26 MPa for five minutes; thereafter, the card medium laminated body 2 was further pressurized under a pressure of 0.65 MPa and was held for seven minutes; thereafter, with the pressure of 0.65 MPa retained, cooling was conducted therefor up to a room temperature; and the obtained resin card medium molded body was singulated into pieces each having a card shape, thereby preparing a resin card medium 1 in Example 1 whose dimensions were in conformity with the ISO/IEC 7810:2003 standard (0.76 mm-thick×85.60 mm-wide×53.98 mm-high).

Figure 2:
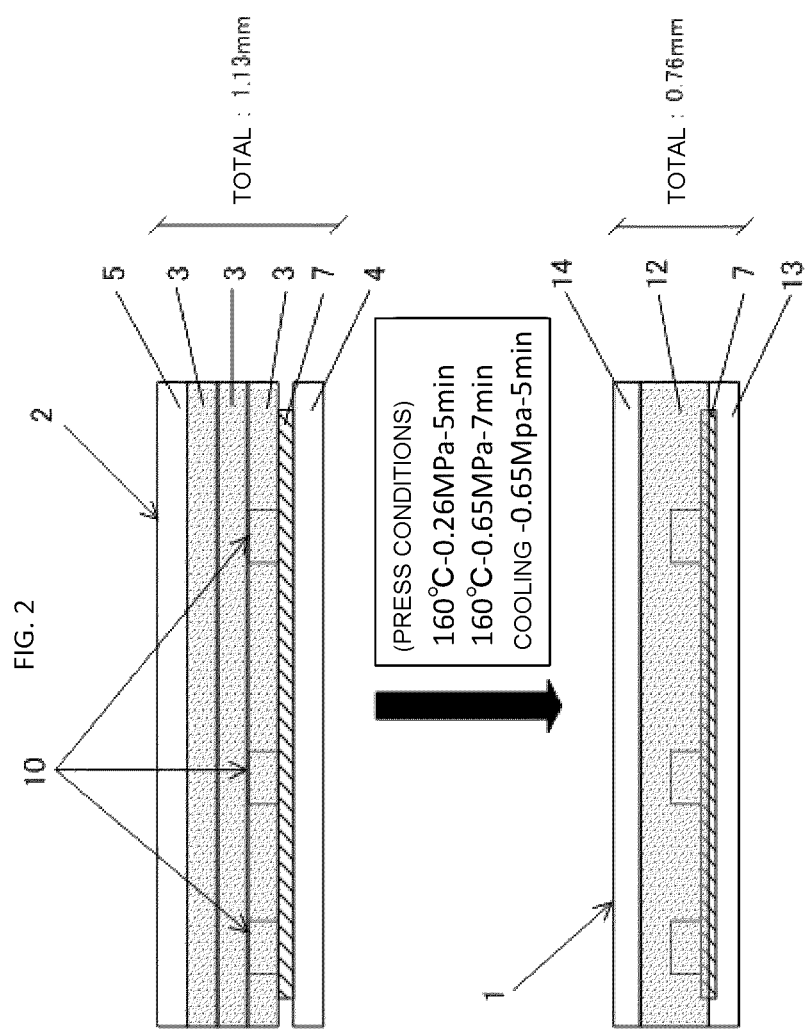
FIG. 2 is a diagram schematically showing cross sections of a card medium in Example 2 before and after hot pressing molding.

Example 2 (See FIG. 2)

(1) Card Medium Laminated Body

The same configuration as that in Example 1 except that three plastic pseudo chips C (10) each having a 7-mm-square size and a thickness of 0.2 mm were used and arranged in appropriate positions on a substrate 7 was employed, thereby forming a card medium laminated body 2 in Example 2.

(2) Hot Pressing Molding

The card medium laminated body 2 in Example 2 was subjected to hot pressing molding under the same conditions as those in Example 1, thereby preparing a resin card medium 1 in Example 2 whose shape and dimensions were in conformity with the ISO/IEC 7810:2003 standard.

Figure 3:
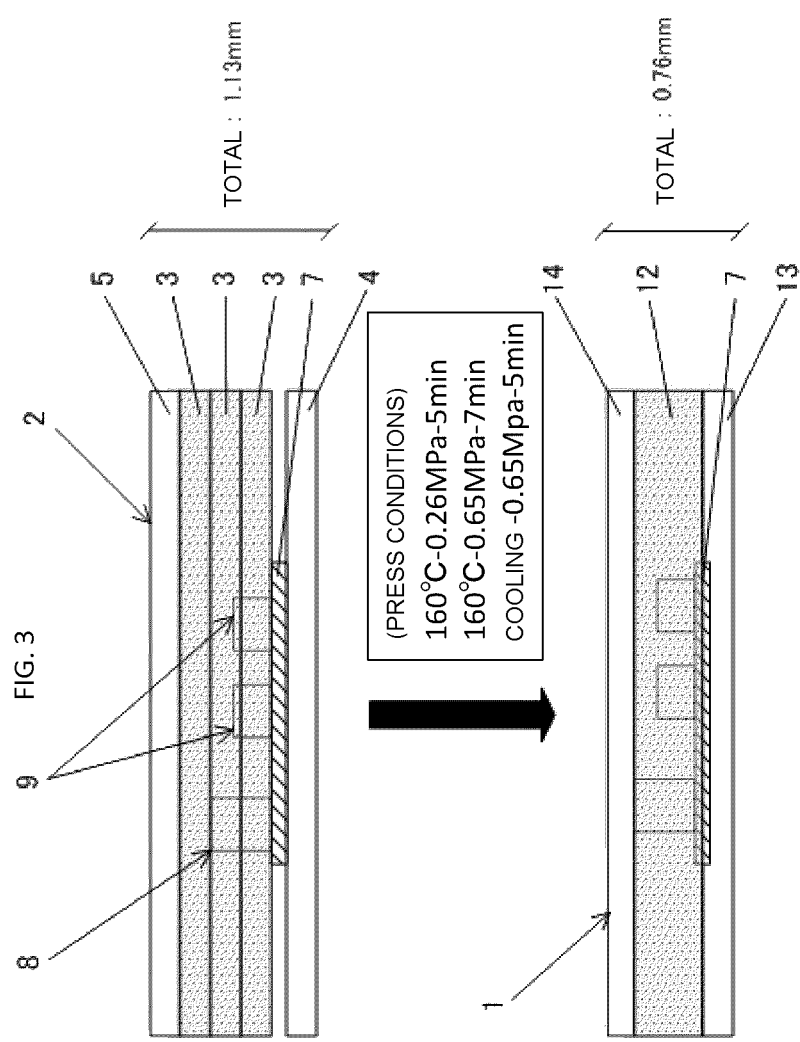
FIG. 3 is a diagram schematically showing cross sections of a card medium in Example 3 before and after hot pressing molding.

Example 3 (See FIG. 3)

(1) Card Medium Laminated Body

The same configuration as that in Example 1 except that a substrate 7 (with a product name "Polyimide Substrate") having a size of 35 mm×40 mm and a thickness of 0.10 mm was used was employed, thereby forming a card medium laminated body 2 in Example 3.

(2) Hot Pressing Molding

The card medium laminated body 2 in Example 3 was subjected to hot pressing molding under the same conditions as those in Example 1, thereby preparing a resin card medium 1 in Example 3 whose shape and dimensions were in conformity with the ISO/IEC 7810:2003 standard.

Figure 4:
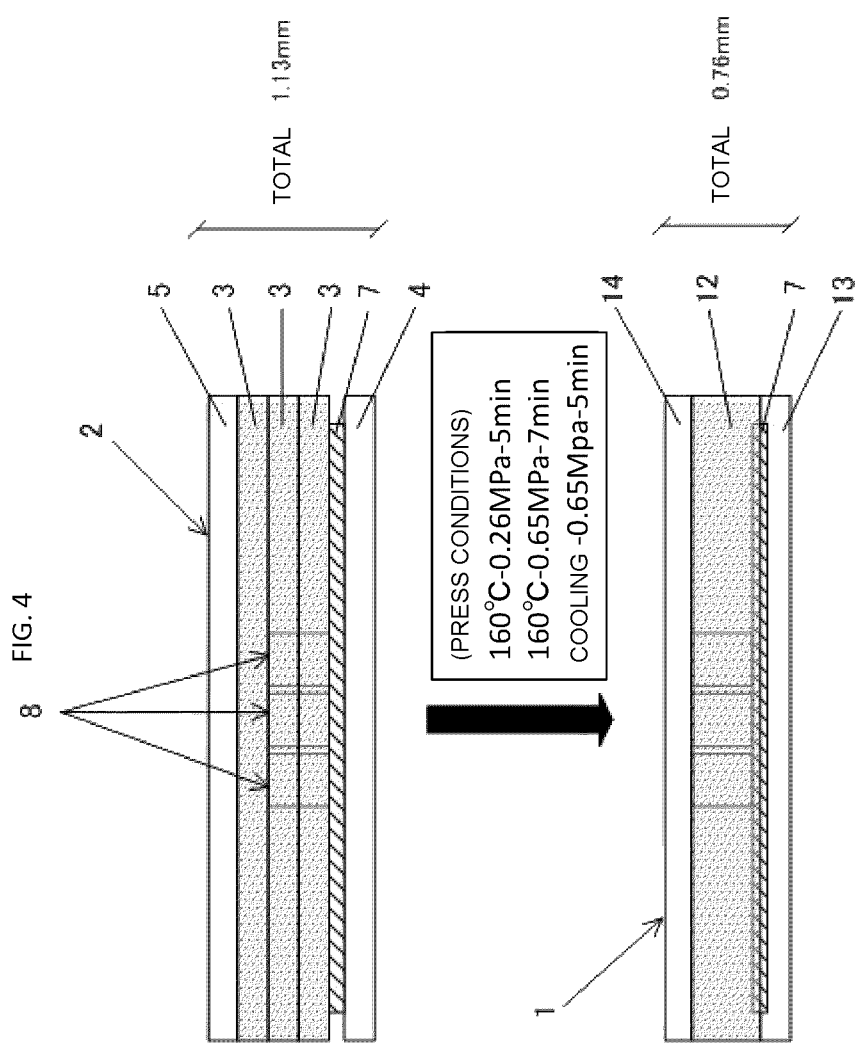
FIG. 4 is a diagram schematically showing cross sections of a card medium in Example 4 before and after hot pressing molding.

Example 4 (See FIG. 4)

(1) Card Medium Laminated Body

The same configuration as that in Example 1 except that three plastic pseudo chips A (8) each having a 7-mm-square size and a thickness of 0.4 mm were used and arranged at mutual narrow intervals on a substrate 7 was employed, thereby forming a card medium laminated body 2 in Example 4.

(2) Hot Pressing Molding

The card medium laminated body 2 in Example 4 was subjected to hot pressing molding under the same conditions as those in Example 1, thereby preparing a resin card medium 1 in Example 4 whose shape and dimensions were in conformity with the ISO/IEC 7810:2003 standard.

Figure 5:
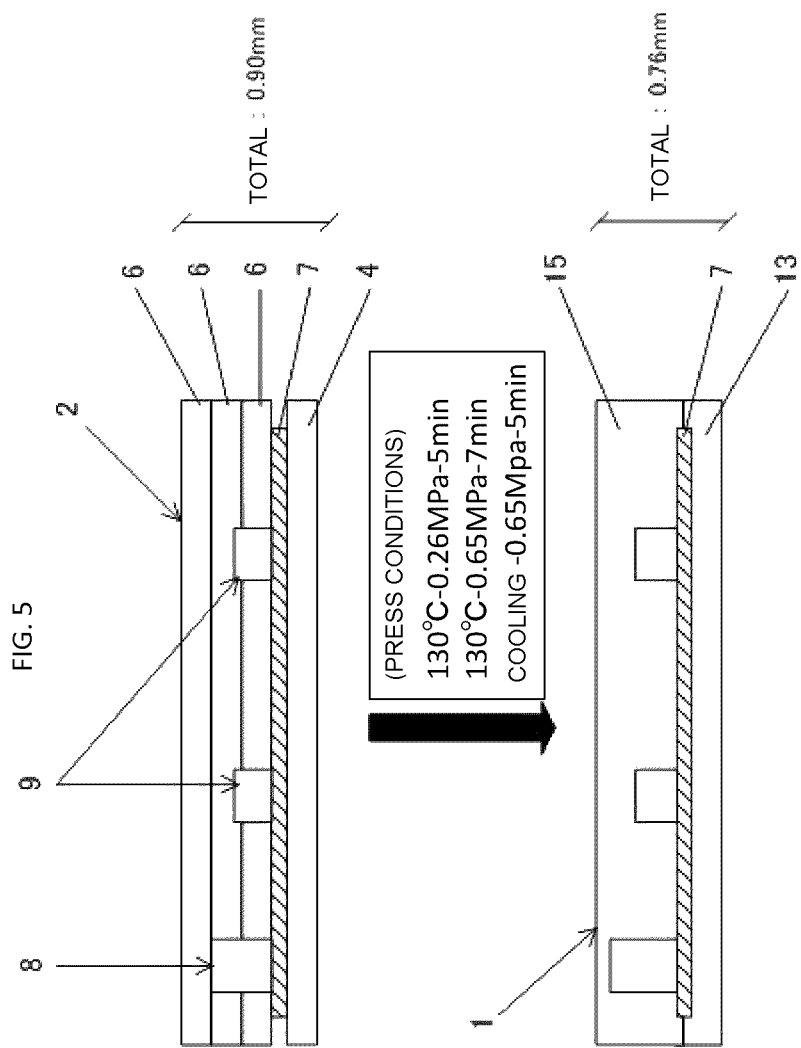
FIG. 5 is a diagram schematically showing cross sections of a card medium in Comparative Example 1 before and after hot pressing molding.

Comparative Example 1 (See FIG. 5)

(1) Card Medium Laminated Body

The same configuration as that in Example 1 except that instead of the three pieces of the mixed paper 3 (with the product name "SC-01", manufactured by TOMOEGAWA CO., LTD., having the thickness of 0.21 mm and the softening point of 130° C.) constituted of copolymerized polyester resin (PET resin) fibers and plant fibers, three plastic laminated sheets 6 (each with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) were laminated and a second finishing sheet 5 (with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) was omitted was employed, thereby forming a card medium laminated body 2 in Comparative Example 1.

(2) Hot Pressing Molding

The card medium laminated body 2 in Comparative Example 1 was subjected to hot pressing molding under the same conditions as those in Example 1 except that the heating condition was changed from 160° C. to 130° C. and the plastic laminated sheets 6 formed of the PETG were melted by a hot pressing machine, thereby preparing a resin card medium 1 in Comparative Example 1 whose shape and dimensions were in conformity with the ISO/IEC 7810:2003 standard.

Figure 6:
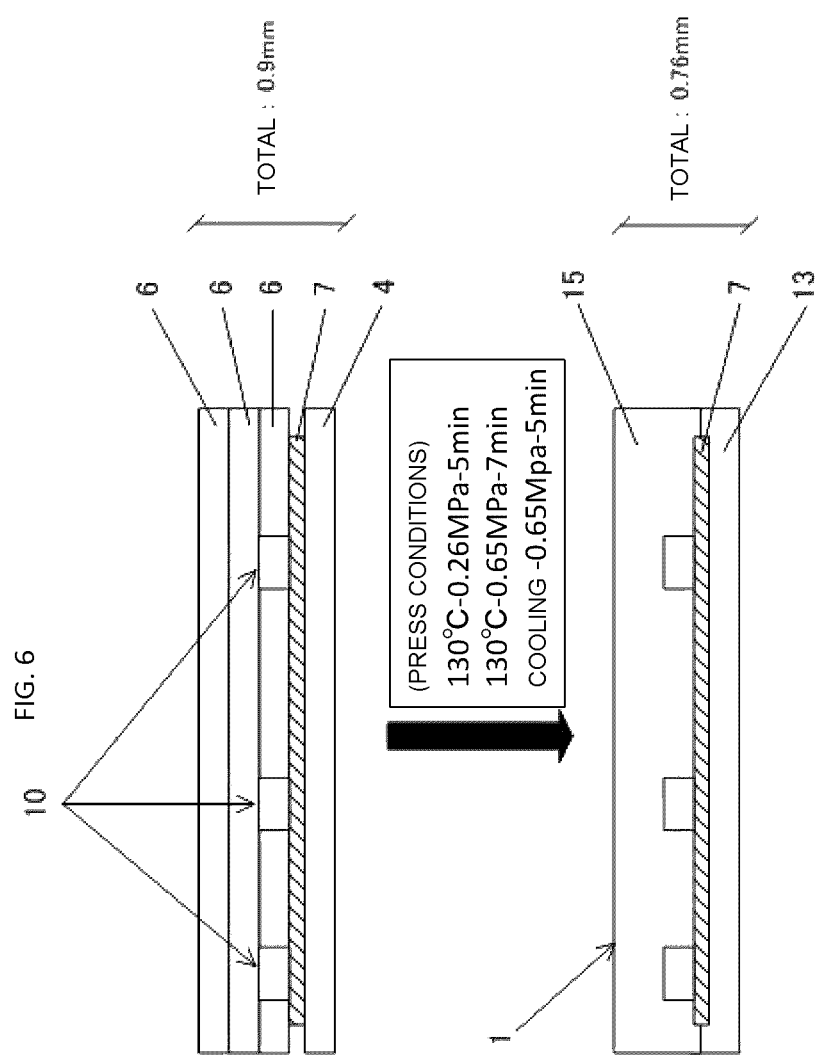
FIG. 6 is a diagram schematically showing cross sections of a card medium in Comparative Example 2 before and after hot pressing molding.

Comparative Example 2 (See FIG. 6)

(1) Card Medium Laminated Body

The same configuration as that in Example 2 except that instead of the three pieces of the mixed paper 3 (with the product name "SC-01", manufactured by TOMOEGAWA CO., LTD., having the thickness of 0.21 mm and the softening point of 130° C.) constituted of the copolymerized polyester resin (PET resin) fibers and the plant fibers, three plastic laminated sheets 6 (each with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) were laminated and a second finishing sheet 5 (with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) was omitted was employed, thereby forming a card medium laminated body 2 in Comparative Example 2.

(2) Hot Pressing Molding

The card medium laminated body 2 in Comparative Example 2 was subjected to hot pressing molding under the same conditions as those in Example 2 except that the heating condition was changed from 160° C. to 130° C. and the plastic laminated sheets 6 formed of the PETG were melted by a hot pressing machine, thereby preparing a resin card medium 1 in Comparative Example 2 whose shape and dimensions were in conformity with the ISO/IEC 7810:2003 standard.

Figure 7:
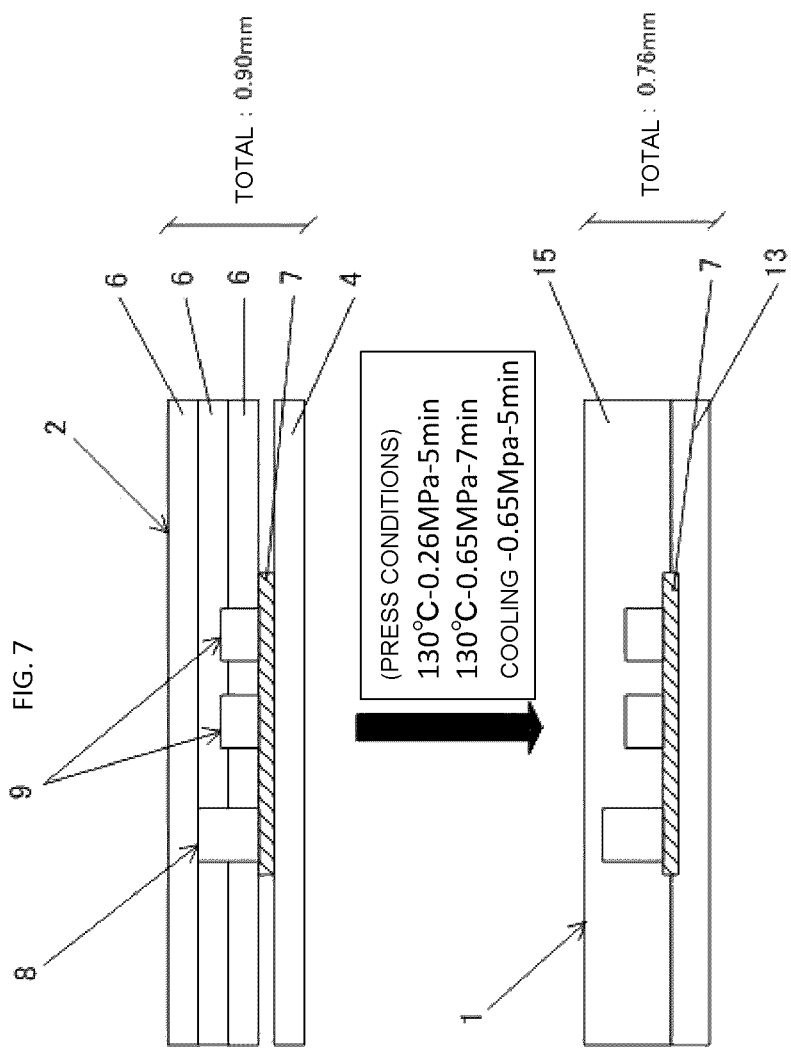
FIG. 7 is a diagram schematically showing cross sections of a card medium in Comparative Example 3 before and after hot pressing molding.

Comparative Example 3 (See FIG. 7)

(1) Card Medium Laminated Body

The same configuration as that in Example 3 except that instead of the three pieces of the mixed paper 3 (with the product name "SC-01", manufactured by TOMOEGAWA CO., LTD., having the thickness of 0.21 mm and the softening point of 130° C.) constituted of the copolymerized polyester resin (PET resin) fibers and the plant fibers, two plastic laminated sheets 6 (with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) were laminated and a second finishing sheet 5 (with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) was omitted was employed, thereby forming a card medium laminated body 2 in Comparative Example 3.

(2) Hot Pressing Molding

The card medium laminated body 2 in Comparative Example 3 was subjected to hot pressing molding under the same conditions as those in Example 3 except that the heating condition was changed from 160° C. to 130° C. and the plastic laminated sheets 6 formed of the PETG were melted by a hot pressing machine, thereby preparing a resin card medium 1 in Comparative Example 3 whose shape and dimensions were in conformity with the ISO/IEC 7810:2003 standard.

Figure 8:
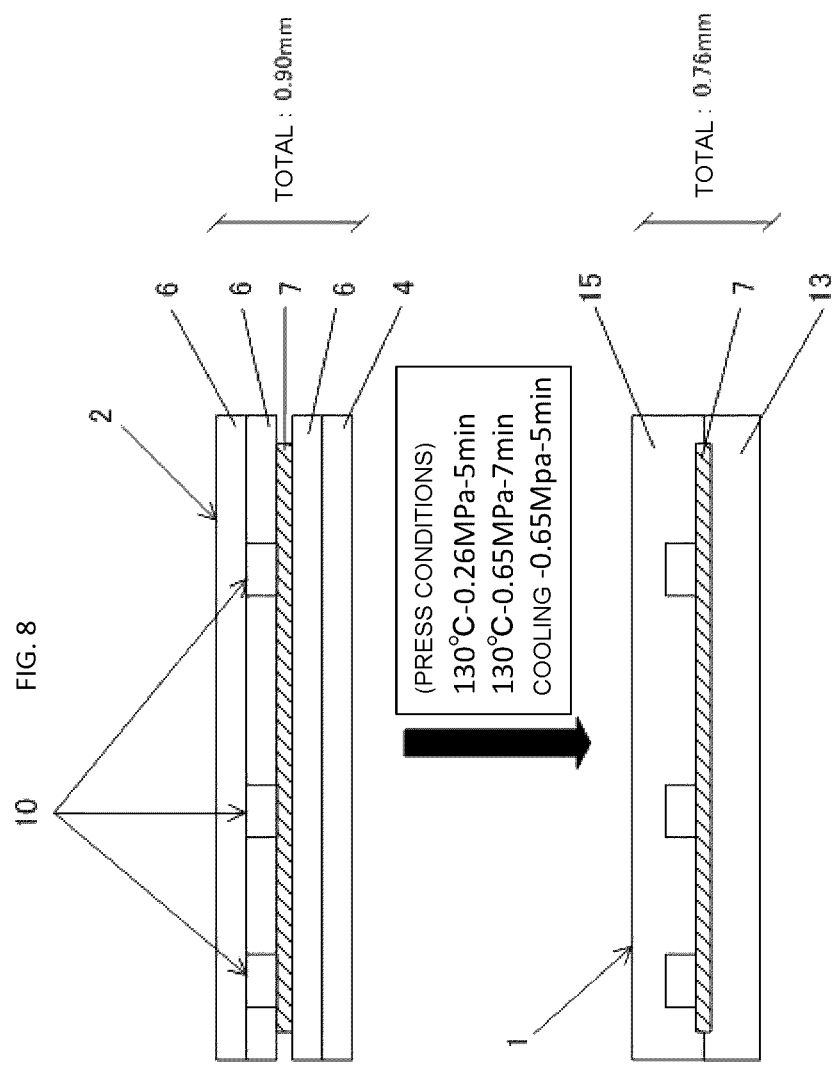
FIG. 8 is a diagram schematically showing cross sections of a card medium in Comparative Example 4 before and after hot pressing molding.

Comparative Example 4 (See FIG. 8)

(1) Card Medium Laminated Body

On a substrate 7 (with a product name "Polyimide Substrate") having a size of 35 mm×78 mm and a thickness of 0.10 mm, three plastic pseudo chips C (10) each having a 7-mm-square size and a thickness of 0.2 mm were arranged in appropriate positions, thereby preparing a substrate 7 having the pseudo chips 10 installed thereon.

Next, two first finishing sheets 4 (each with a product name "DIAFIX PG-WHI-FG", manufactured by Mitsubishi Plastics, Inc., having a thickness of 0.20 mm and a melting point of 80° C.) formed of polyethylene terephthalate glycol-modified (PETG) were prepared; and with a side of the above-mentioned substrate 7, on which the pseudo chips 10 were installed, facing upward, two plastic laminated sheets 6 (each with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) were laminated thereon, thereby forming a card medium laminated body 2 in Comparative Example 4.

In other words, the card medium laminated body 2 in Comparative Example 4 has the same configuration as that of the card medium laminated body 2 in Comparative Example 2 except that the number of the first finishing sheets 4 laminated on a rear surface of the substrate 7 on which the pseudo chips 10 were installed and the number of the plastic laminated sheets 6 laminated on a front surface of the substrate 7 were both two.

(2) Hot Pressing Molding

Hot pressing molding conditions for the card medium laminated body 2 in Comparative Example 4 are the same as those for the card medium laminated body 2 in Comparative Example 2.

In other words, the card medium laminated body 2 in Comparative Example 4 was subjected to hot pressing molding under the same conditions as those in Example 2 except that the heating condition was changed from 160° C. to 130° C. and the plastic laminated sheets 6 formed of the PETG were melted by a hot pressing machine, thereby preparing a resin card medium 1 in Comparative Example 4 whose shape and dimensions were in conformity with the ISO/IEC 7810:2003 standard.

Figure 9:
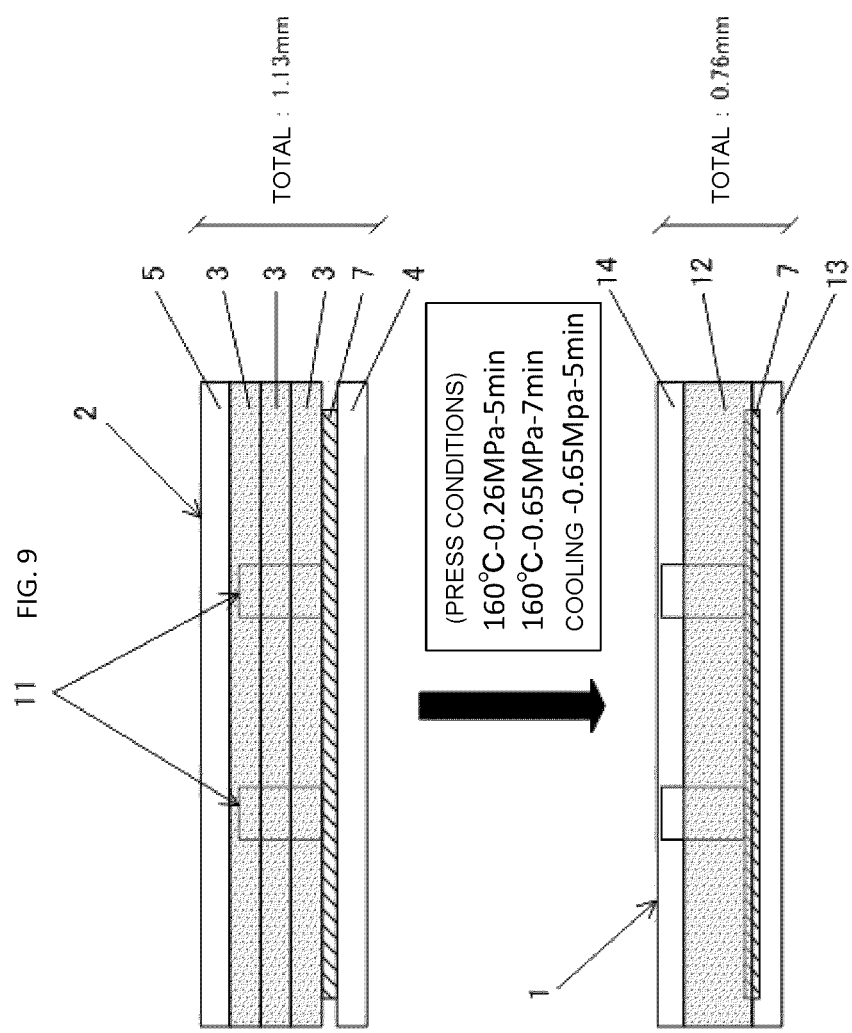
FIG. 9 is a diagram schematically showing cross sections of a card medium in Comparative Example 5 before and after hot pressing molding.

Comparative Example 5 (See FIG. 9)

(1) Card Medium Laminated Body

The same configuration as that in Example 1 except that two plastic pseudo chips D (11) each having a 7-mm-square size and a thickness of 0.55 mm were used and arranged in appropriate positions on a substrate 7 was employed, thereby forming a card medium laminated body 2 in Comparative Example 5.

(2) Hot Pressing Molding

The card medium laminated body 2 in Comparative Example 5 was subjected to hot pressing molding under the same conditions as those in Example 1, thereby preparing a resin card medium 1 in Comparative Example 5 whose shape and dimensions were in conformity with the ISO/IEC 7810:2003 standard.

Figure 10:
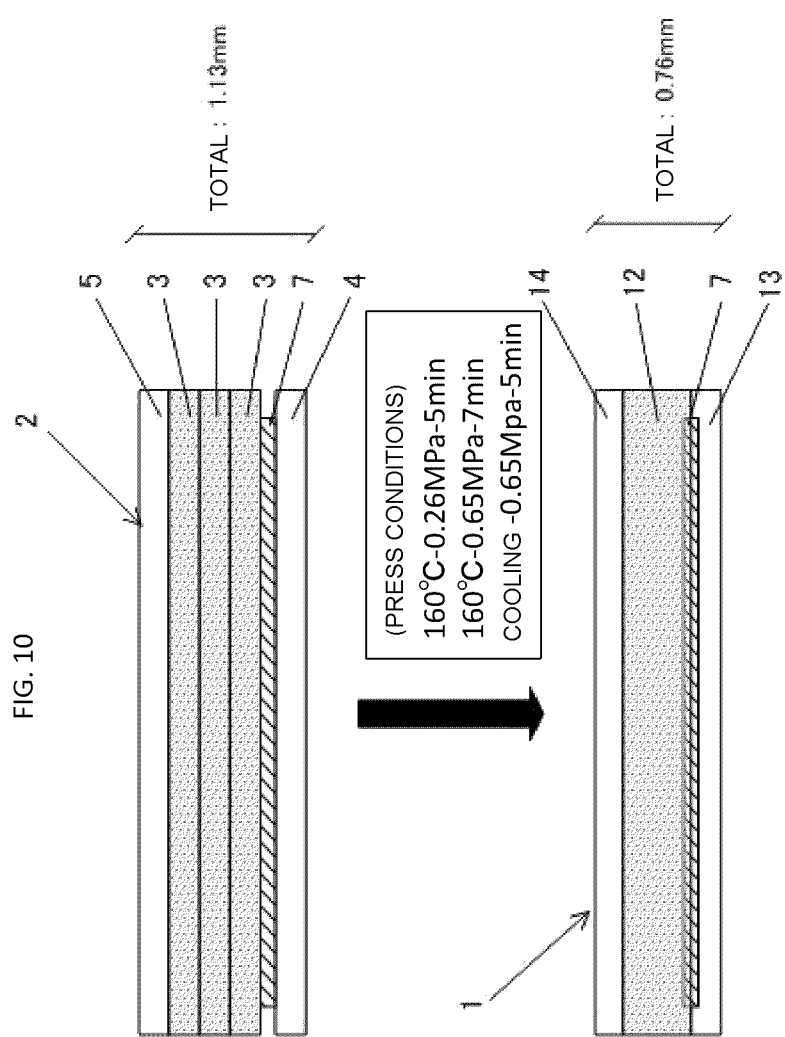
FIG. 10 is a diagram schematically showing cross sections of a card medium in Reference Example 1 before and after hot pressing molding.

Reference Example 1 (See FIG. 10)

(1) Card Medium Laminated Body

The same configuration as that in Example 1 except that no plastic pseudo chips were arranged on a substrate 7 at all was employed, thereby forming a card medium laminated body 2 in Reference Example 1.

(2) Hot Pressing Molding

The card medium laminated body 2 in Reference Example 1 was subjected to hot pressing molding under the same conditions as those in Example 1, thereby preparing a resin card medium 1 in Reference Example 1 whose shape and dimensions were in conformity with the ISO/IEC 7810:2003 standard.

Figure 11:
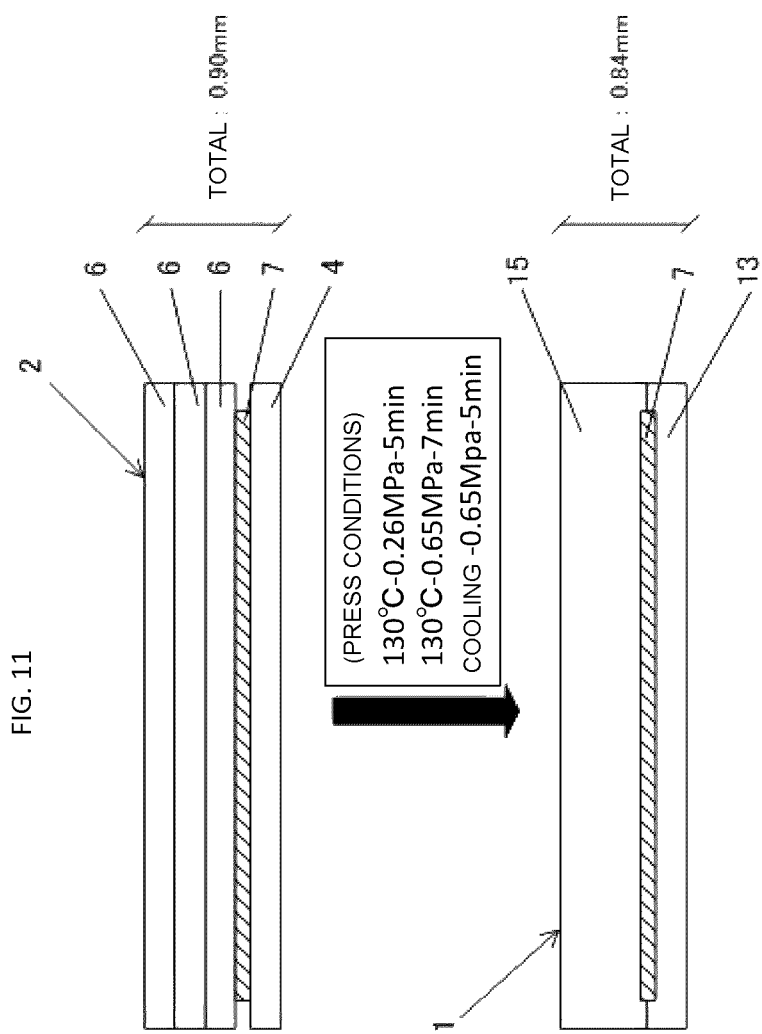
FIG. 11 is a diagram schematically showing cross sections of a card medium in Reference Example 2 before and after hot pressing molding.

Reference Example 2 (See FIG. 11)

(1) Card Medium Laminated Body

The same configuration as that in Reference Example 1 except that instead of the three pieces of the mixed paper 3 (with a product name "SC-01", manufactured by TOMOEGAWA CO., LTD., having a thickness of 0.21 mm and a softening point of 130° C.) constituted of the copolymerized polyester resin (PET resin) fibers and the plant fibers, three plastic laminated sheets 6 (each with a product name "DIAFIX PG-WHI-FG", manufactured by Mitsubishi Plastics, Inc., having a thickness of 0.20 mm and a melting point of 80° C.) formed of polyethylene terephthalate glycol-modified (PETG) were laminated and a second finishing sheet 5 (with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) was omitted was employed, thereby forming a card medium laminated body 2 in Reference Example 2.

(2) Hot Pressing Molding

The card medium laminated body 2 in Reference Example 2 was subjected to hot pressing molding under the same conditions as those in Reference Example 1 except that the heating condition was changed from 160° C. to 130° C. and the plastic laminated sheets 6 formed of the PETG were melted by a hot pressing machine, thereby preparing a resin card medium 1 in Reference Example 2 whose shape and dimensions were in conformity with the ISO/IEC 7810:2003 standard.

Figure 12:
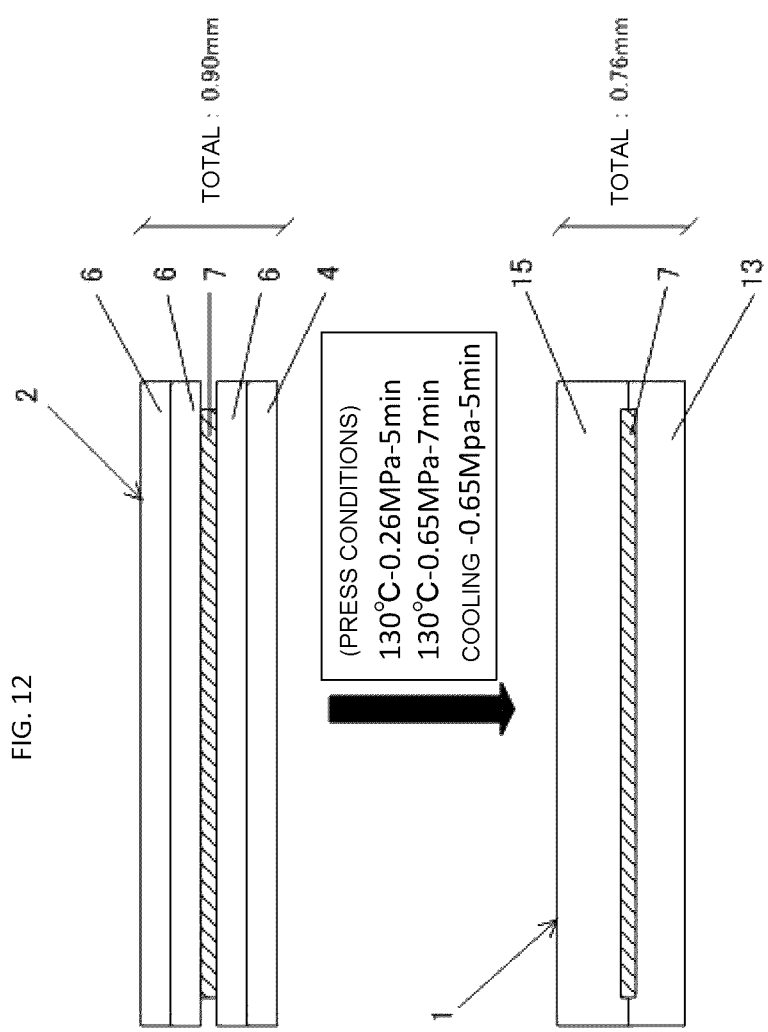
FIG. 12 is a diagram schematically showing cross sections of a card medium in Reference Example 3 before and after hot pressing molding.

Reference Example 3 (See FIG. 12)

(1) Card Medium Laminated Body

Two first finishing sheets 4 (each with a product name "DIAFIX PG-WHI-FG", manufactured by Mitsubishi Plastics, Inc., having a thickness of 0.20 mm and a melting point of 80° C.) formed of polyethylene terephthalate glycol-modified (PETG) were prepared; a substrate 7 having no pseudo chips installed thereon at all was laminated thereon; and two plastic laminated sheets 6 (each with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) were laminated, thereby forming a card medium laminated body 2 in Reference Example 3.

In other words, the card medium laminated body 2 in Reference Example 3 has the same configuration as that of the card medium laminated body 2 in Reference Example 2 except that the number of the first finishing sheets 4 laminated on a rear surface of the substrate 7 and the number of the plastic laminated sheets 6 laminated on a front surface of the substrate 7 were both two.

(2) Hot Pressing Molding

The card medium laminated body 2 in Reference Example 3 was subjected to hot pressing molding under the same conditions as those in Reference Example 2, thereby preparing a resin card medium 1 in Reference Example 3 whose shape and dimensions were in conformity with the ISO/IEC 7810:2003 standard.

Figure 13:
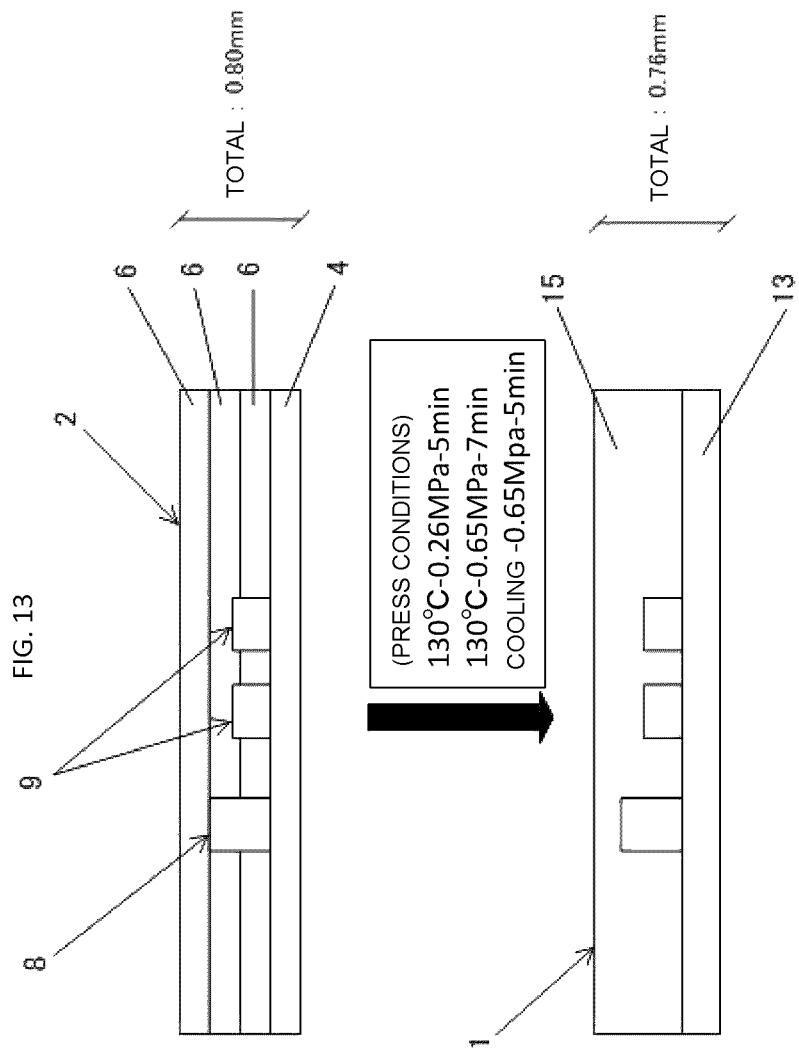
FIG. 13 is a diagram schematically showing cross sections of a card medium in Reference Example 4 before and after hot pressing molding.

Reference Example 4 (See FIG. 13)

(1) Card Medium Laminated Body

One first finishing sheet 4 (with a product name "DIAFIX PG-WHI-FG", manufactured by Mitsubishi Plastics, Inc., having a thickness of 0.20 mm and a melting point of 80° C.) formed of polyethylene terephthalate glycol-modified (PETG) was prepared; one plastic pseudo chip A (8) having a 7-mm-square size and a thickness of 0.4 mm and two plastic pseudo chips B (9) having a 7-mm-square size and a thickness of 0.25 mm were arranged in appropriate positions thereon; and three plastic laminated sheets 6 (each with a product name "DIAFIX PG-WHI-FG", manufactured by Mitsubishi Plastics, Inc., having a thickness of 0.20 mm and a melting point of 80° C.) formed of the polyethylene terephthalate glycol-modified (PETG) were laminated thereon, thereby forming a card medium laminated body 2 in Reference Example 4.

In other words, the card medium laminated body 2 in Reference Example 4 has the same configuration as that of the card medium laminated body 2 in each of Comparative Examples 1 and 3 except that the card medium laminated body 2 has no substrate 7.

(2) Hot Pressing Molding

The card medium laminated body 2 in Reference Example 4 was subjected to hot pressing molding under the same conditions as those in each of Comparative Examples 1 and 3, thereby preparing a resin card medium 1 in Reference Example 4 whose shape and dimensions were in conformity with the ISO/IEC 7810:2003 standard.

2. Shape Evaluation of Resin Card Mediums (1) Warpage Amounts of Resin Card Mediums As to warpage amounts of the resin card mediums, maximum distances from a plane of a surface plate were measured on all portions of protruding surfaces in conformity with the ISO/IEC 7810:2003 standard by using a laser displacement sensor (LK-030, manufactured by KEYENCE CORPORATION).

(2) Evaluation of Surface Depressions of Resin Card Mediums

Surface depressions of the resin card mediums were measured by using the laser displacement sensor (LK-030, manufactured by KEYENCE CORPORATION) and were evaluated as follows.

Figure 14:
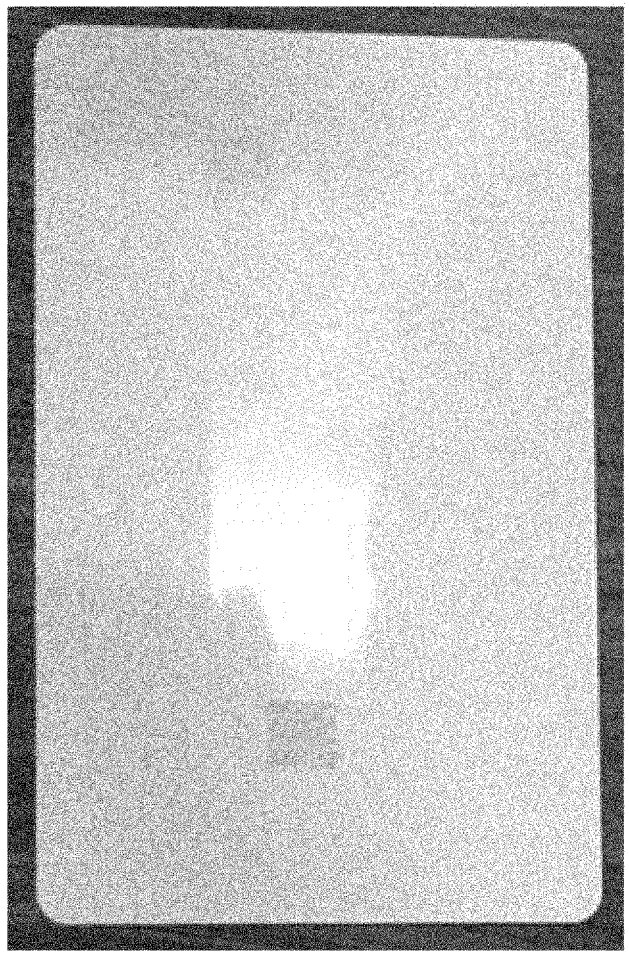
FIG. 14 is a photograph of the card medium in Example 1 before and after the hot pressing molding.

A mark "○" indicates a case in which any depression such as a sink and a flaw whose depth was 0.2 mm or more was not present on a surface of a resin card medium (see FIG. 14).

A mark "Δ" indicates a case in which one depression such as the sink and the flaw whose depth was 0.2 mm or more was present and one or more depressions such as the sink and the flaw whose each depth was 0.1 mm or more and less than 0.2 mm were also present on a surface of a resin card medium.

Figure 15:
FIG. 15 is a photograph of the card medium in Comparative Example 1 before and after the hot pressing molding.

A mark "x" indicates a case in which two or more depressions such as the sink and the flaw whose each depth was 0.2 mm or more were present on a surface of a resin card medium (see FIG. 15).

Manufacturing conditions and test results of the resin card mediums in the above-described Examples 1 to 4, Comparative Examples 1 to 5, and Reference Examples 1 to 4 are shown in the following Table 1.

TABLE 1

| | Manufacturing Conditions of Card Medium | | | | | Test Results of Card Medium | | |
|---|---|---|---|---|---|---|---|---|
| | Laminate Material on Chip Side | Area of 0.1 mm-Thick Substrate *1 | Height and Number of Chips with 7-mm-Square Size | Maximum Substrate Thickness (Including Maximum Chip Thickness) | Maximum Substrate Thickness/Card Thickness × 100 | Evaluation of Warpage Amount *2 | Evaluation of Depression | Comprehensive Evaluation |
| Example 1 | PET Mixed Paper | 35 mm × 78 mm | 0.4 mm × 1<br>0.25 mm × 2 | 0.5 mm | 65.8% | 0.89 mm<br>○ | ○ | ○ |
| Example 2 | PET Mixed Paper | 35 mm × 78 mm | 0.2 mm × 3 | 0.3 mm | 39.5% | 1.07 mm<br>○ | ○ | ○ |
| Example 3 | PET Mixed Paper | 35 mm × 40 mm | 0.4 mm × 1<br>0.25 mm × 2 | 0.5 mm | 65.8% | 1.12 mm<br>○ | ○ | ○ |
| Example 4 | PET Mixed Paper | 35 mm × 78 mm | 0.4 mm × 3 | 0.5 mm | 65.8% | 0.98 mm<br>○ | ○ | ○ |
| Comparative Example 1 | PETG | 35 mm × 78 mm | 0.4 mm × 1<br>0.25 mm × 2 | 0.5 mm | 65.8% | 2.72 mm<br>x | x | x |
| Comparative Example 2 | PETG | 35 mm × 78 mm | 0.2 mm × 3 | 0.3 mm | 39.5% | 2.99 mm<br>x | x | x |
| Comparative Example 3 | PETG | 35 mm × 40 mm | 0.4 mm × 1<br>0.25 mm × 2 | 0.5 mm | 65.8% | 2.30 mm<br>x | x | x |
| Comparative Example 4 | PETG | 35 mm × 78 mm | 0.2 mm × 3 | 0.3 mm | 39.5% | 1.85 mm<br>x | x | x |
| Comparative Example 5 | PET Mixed Paper | 35 mm × 78 mm | 0.55 mm × 2 | 0.65 mm | 85.5% | 0.91 mm<br>○ | Δ | x |
| Reference Example 1 | PET Mixed Paper | 35 mm × 78 mm | — | 0.1 mm | 13.2% | 0.85 mm<br>○ | ○ | No Chip |
| Reference Example 2 | PETG | 35 mm × 78 mm | — | 0.1 mm | 13.2% | 2.8 mm<br>x | Δ | No Chip |

TABLE 1-continued

| | Manufacturing Conditions of Card Medium | | | | Test Results of Card Medium | | |
|---|---|---|---|---|---|---|---|
| | Laminate Material on Chip Side | Area of 0.1 mm-Thick Substrate *1 | Height and Number of Chips with 7-mm-Square Size | Maximum Substrate Thickness (Including Maximum Chip Thickness) | Maximum Substrate Thickness/Card Thickness × 100 | Evaluation of Warpage Amount *2 | Evaluation of Depression | Comprehensive Evaluation |
| Reference Example 3 | PETG | 35 mm × 78 mm | — | 0.1 mm | 13.2% | 0.91 mm ○ | Δ | No Chip |
| Reference Example 4 | PETG | — | 0.4 mm × 1 0.25 mm × 2 | 0.4 mm | 52.6% | 0.84 mm ○ | x | No Substrate |

*1 Shape of Card Medium after Hot Press Molding: 0.76 mm-Thick × 85.60 mm-Wide × 53.98 mm-High
*2 Permissible Range of Warpage Amount of Card Medium: Not Exceeding 1.5 mm (ISO/IEC 7810 Standard)

By comparing Examples 1 to 4 and Comparative Examples 1 to 4, it has been found out from Table 1 that whereas when a total of thicknesses of each substrate and chips was changed by installing the pseudo chips having the different heights, in each of Comparative Examples 1 to 4 in which all of the substrate surface on the side on which the chips were installed was covered with the laminated sheets (plant fiber-non-containing resin layers not containing the plant fibers after the hot pressing molding) formed of the polyethylene terephthalate glycol-modified (PETG), the depressions due to the warpage, the sink, and the like whose each depth exceeded 1.5 mm were caused (see FIG. 15), in each of Examples 1 to 4 in which all of the substrate surface on the side on which the chips were installed was covered with the mixed paper (plant fiber-containing resin layer containing the plant fibers after the hot pressing molding) constituted of the copolymerized polyester resin (PET resin) fibers and the plant fibers, the depression due to the warpage, the sink, and the like whose depth exceeded 1.5 mm was not caused (see FIG. 14).

Although the detailed mechanism of this is unknown, it is inferred that in the case of each of Comparative Examples 1 to 4, since the plant fibers which inhibit flowing of the molten resin and function as a cushion material absorbing the thicknesses of the chips upon hot pressing or function to inhibit or suppress deformation of the card medium are not contained in the laminated sheets (plant fiber-non-containing resin layers) formed of the PETG, the depressions or the flaws due to the sink and the like caused by solidification speed unevenness and flowing unevenness of the molten resin and the like are caused on the card surface or a residual stress in the card is caused, and the residual stress is released after molding, thereby resulting in the large warpage of the card medium.

On the other hand, it is inferred that in the case of each of Examples 1 to 4, the plant fibers which inhibit flowing of the softened resin and function as a cushion material absorbing the thicknesses of the chips upon hot pressing or function to inhibit or suppress the deformation of the card medium are contained in the mixed paper (plant fiber-containing resin layers), generation of the sink due to curing speed unevenness and flowing unevenness of the softened resin and the like is suppressed, and further, even if a residual stress is caused in the card, the plant fibers serve as a reinforcing material, deformation of the card is thereby restrained, and as a result, the release of the residual stress is suppressed and the warpage or the deformation of the card is thereby prevented.

Note that by comparing Example 1 and Example 3, by comparing Comparative Example 1, Comparative Example 3, and Reference Example 4, by comparing Example 1 and Comparative Example 3, or by comparing Comparative Example 1 and Example 3, it has been found out that a ratio of an occupancy area of the substrate to an area of the card medium hardly exerts an influence on flatness and smoothness of the card such as a magnitude of the warpage amount of the card and presence or absence of the generation of a local depressed part of the card.

In addition, by comparing Examples 1, 2, and 4 and Comparative Example 5, it has been found out that in order to cause the mixed paper (plant fiber-containing resin layers containing the plant fibers after the hot pressing molding) constituted of the copolymerized polyester resin (PET resin) fibers and the plant fibers to surely absorb the thicknesses of the pseudo chips and the substrate, it is required to adjust a percentage of a total of the thickness of the substrate and the thicknesses of the chips to a thickness of the card medium after the hot pressing molding to 80% or less or more preferably, to 70% or less. As a result of this, in the card medium in each of Examples 1 to 4, extremely excellent flatness and smoothness in that the warpage amount of the card medium in conformity with the ISO/IEC 7810:2003 standard is 1.5 mm or less and besides the above-mentioned ISO standard, the depth of the local depressed part of the card is less than 0.2 mm can be obtained.

By comparing Reference Example 2 and Reference Example 3, it has been found out that a position of the substrate in a thickness direction of the card medium is disposed in such a way as to be displaced to a front side or a rear side from a middle position, large warpage of the card medium is caused. It is inferred that since the thickness of the molten resin layer on the front side of the substrate and the thickness of the molten resin layer on the rear side thereof are different from each other, solidification speed unevenness, flowing unevenness, and the like are caused between the front side and the rear side of the substrate, and a residual stress caused in the card is released after molding, thereby resulting in the large warpage of the card medium.

On the other hand, by comparing Reference Example 1 and Reference Example 2, it is inferred that in the case of Reference Example 1 in which the mixed paper (plant fiber-containing resin layers) constituted of the copolymerized polyester resin (PET resin) fibers and the plant fibers is used, since the plant fibers whose shapes, nature, and the like hardly change even if an influence of heat is exerted thereon are contained in the mixed paper, even if temperature unevenness, flowing unevenness, and curing speed unevenness of the copolymerized polyester resin (PET resin) fibers are caused due to the placement of the substrate displaced to the front side or the rear side, the plant fibers serve as a reinforcing material, deformation of the card is thereby restrained, and as a result, a release of the residual stress is prevented and the warpage and deformation of the card are thereby prevented.

Therefore, in the case of Reference Example 1, regardless of presence or absence of the pseudo chips, even when the substrate is disposed in such a way as to be displace from the middle position in the thickness direction of the card medium to the front side or the rear side in a longitudinal cross sectional view, the warpage amount of the card in conformity with the ISO/IEC 7810:2003 standard is 1.5 mm or less and besides the above-mentioned ISO standard, extremely excellent flatness and smoothness in that the depth of the local depressed part of the card is less than 0.2 mm can be obtained.

REFERENCE SIGNS LIST

1 . . . Resin card medium
2 . . . Resin card medium laminated body
3 . . . Mixed paper (PET mixed paper with a thickness of 0.21 mm)
4 . . . First finishing sheet (PETG with a thickness 0.20 mm)
5 . . . Second finishing sheet (PETG with thickness of 0.20 mm)
6 . . . Plastic laminated sheet (PETG with a thickness of 0.20 mm)
7 . . . Substrate (with a thickness of 0.10 mm)
8 . . . Pseudo chip A (with a 7-mm-square size and a thickness of 0.4 mm)
9 . . . Pseudo chip B (with a 7-mm-square size and a thickness of 0.25 mm)
10 . . . Pseudo chip C (with a 7-mm-square size and a thickness of 0.2 mm)
11 . . . Pseudo chip D (with a 7-mm-square size and a thickness of 0.55 mm)
12 . . . Plant fiber-containing resin layer
13 . . . First finishing layer (fiber-non-containing resin layer)
14 . . . Second finishing layer (fiber-non-containing resin layer)
15 . . . Fiber-non-containing resin layer

The invention claimed is:

1. A resin card medium comprising:
a substrate having one electronic component or two or more electronic components installed on and protruding out from one side of the substrate;
a plant fiber-containing resin layer being laminated on a surface of the substrate on a side on which the electronic component or electronic components are installed and containing plant fibers, and said plant fiber-containing resin layer only partially covers at least one of the electronic component(s);
a first finishing layer being laminated on a surface of the substrate on a side opposite to the side on which the electronic component or electronic components are installed, and
a second finishing layer is further laminated on the plant fiber-containing resin layer such that the plant fiber-containing resin layer is between the substrate and the second finishing layer,
wherein a percentage of a total of a thickness of the substrate and a thickness or thicknesses of the electronic component or electronic components to a thickness of the card medium is 80% or less.

2. The resin card medium according to claim 1, wherein the percentage of the total of the thickness of the substrate and the thickness or thicknesses of the electronic component or electronic components to the thickness of the card medium is 70% or less.

3. The resin card medium according to claim 1, wherein the substrate is disposed in such a way as to be displaced to a front side or a rear side from a middle position in a thickness direction of the resin card medium in a longitudinal cross sectional view.

4. The resin card medium according to claim 1, further comprising a display part and/or a fingerprint detection part being installed on the substrate and being exposed outside by providing an opening part for one part of the plant fiber-containing resin layer.

5. The resin card medium according to claim 1, wherein the first finishing layer and/or the second finishing layer are/is plant fiber-non-containing resin layers or a plant fiber-non-containing resin layer which contain/contains no plant fibers.

6. The resin card medium according to claim 5, wherein a resin material of the plant fiber-containing resin layer and/or the plant fiber-non-containing resin layer is copolymerized polyester resin.

7. The resin card medium according to claim 5, wherein a resin material of the plant fiber-containing resin layer and/or the plant fiber-non-containing resin layer is polyethylene terephthalate.

8. The resin card medium according to claim 1, wherein a shape and dimensions of the resin card medium are in conformity with an ISO/IEC 7810:2003 standard.

9. The resin card medium according to claim 8, wherein a warpage amount of the resin card medium in conformity with the ISO/IEC 7810:2003 standard is 1.5 mm or less and besides the ISO standard, a depth of a local depressed part of the resin card medium is less than 0.2 mm.

10. A method for manufacturing the resin card medium according to claim 1, which is flat and smooth, comprising the steps of:
preparing a first plastic finishing sheet;
laminating, on the first finishing sheet, a substrate having one electronic component or two or more electronic components installed on and protruding out from one side of the substrate, with the one side of the substrate, on which the electronic component or electronic components are installed, facing upward;
laminating, on the substrate, mixed paper being constituted of plastic fibers and plant fibers,
laminating a second plastic finishing sheet on the mixed paper, and
hot pressing at a temperature which is a softening point or more of the plastic fibers and less than a melting point of the plastic fibers.

11. The method for manufacturing a resin card medium according to claim 10, wherein the resin card medium further comprises a display part and/or a fingerprint detection part being installed on the substrate and being exposed outside the resin card medium after hot pressing molding by providing an opening part for one part of the mixed paper.

12. The method for manufacturing a resin card medium according to claim 10, wherein the plastic fibers are copolymerized polyester resin (PET resin).

13. The method for manufacturing a resin card medium according to claim 10, wherein a thickness of the mixed paper, before pressing, being laminated on a surface of the substrate on a side on which the electronic component or electronic components are installed is thicker than a thickness of the first finishing sheet, before pressing, being laminated beneath a surface of the substrate on a side opposite to the side on which the electronic component or electronic components are installed.

14. The method for manufacturing a resin card medium according to claim 10, wherein a shape and dimensions of the obtained resin card medium are in conformity with an ISO/IEC 7810:2003 standard.

15. The method for manufacturing a resin card medium according to claim 10, wherein a warpage amount, of the obtained resin card medium, in conformity with the ISO/IEC 7810:2003 standard is 1.5 mm or less, and besides the ISO standard, a depth of a local depressed part of the resin card medium is less than 0.2 mm.

16. The method for manufacturing a resin card medium according to claim 10, wherein a percentage of a total of a thickness of the substrate and a thickness or thicknesses of the electronic component or electronic components to a thickness of the resin card medium after the hot pressing molding is adjusted to be 80% or less.

17. The method for manufacturing a resin card medium according to claim 16, wherein the percentage of the total of the thickness of the substrate and the thickness or the thicknesses of the electronic component or electronic components to the thickness of the resin card medium after the hot pressing molding is adjusted to be 70% or less.

18. A method for manufacturing manufacturing the resin card medium according to claim 1, which is flat and smooth, comprising the steps of:
- laminating mixed paper being constituted of plastic fibers and plant fibers;
- laminating, on the mixed paper, a substrate having one electronic component or two or more electronic components installed on and protruding out from one side of the substrate, with the one side of the substrate, on which the electronic component or electronic components are installed, facing downward;
- laminating a first plastic finishing sheet on the substrate, preparing a second plastic finishing sheet beneath the mixed paper; and
- hot pressing at a temperature which is a softening point or more of the plastic fibers and less than a melting point of the plastic fibers.

19. The method for manufacturing a resin card medium according to claim 18, wherein the resin card medium further comprises a display part and/or a fingerprint detection part being installed on the substrate and being exposed outside the resin card medium after hot pressing molding by providing an opening part for one part of the mixed paper.

20. A resin card medium according to claim 1, which has been prepared by
- laminating, on a first plastic finishing sheet, a substrate having one electronic component or two or more electronic components installed on and protruding out from one side of the substrate, with the one side, on which the electronic component or electronic components are installed, facing upward, and
- laminating, on the substrate, mixed paper being constituted of plastic fibers and plant fibers,
- laminating a second plastic finishing sheet on the mixed paper, wherein
- by subjecting the resin card medium laminated body to hot pressing at a temperature which is a softening point or more of the plastic fibers and less than a melting point of the plastic fibers, formed is the resin card medium whose card warpage amount in conformity with an ISO/IEC 7810:2003 standard is 1.5 mm or less and besides the ISO standard, whose depth of a local depressed part of the resin card medium is less than 0.2 mm.

21. The resin card medium according to claim 20, further comprising a display part and/or a fingerprint detection part being installed on the substrate and being exposed outside the resin card medium after hot pressing molding by providing an opening part for one part of the mixed paper.

22. The resin card medium according to claim 20, wherein a percentage of a total of a thickness of the substrate and a thickness or thicknesses of the electronic component or electronic components to a thickness of the resin card medium after the hot pressing molding is 80% or less.

23. The resin card medium according to claim 22, wherein the percentage of the total of the thickness of the substrate and the thickness or thicknesses of the electronic component or electronic components to the thickness of the resin card medium after the hot pressing molding is 70% or less.

* * * * *